US009368652B2

(12) United States Patent
Haupt

(10) Patent No.: US 9,368,652 B2
(45) Date of Patent: Jun. 14, 2016

(54) CONTROLLING THE DIRECT CURRENT FLOW IN A PHOTOVOLTAIC SYSTEM

(75) Inventor: Stefan Haupt, Bonn (DE)

(73) Assignee: Solarworld AG, Bonn (DE)

( * ) Notice: Subject to any disclaimer, the term of this patent is extended or adjusted under 35 U.S.C. 154(b) by 905 days.

(21) Appl. No.: 13/478,795

(22) Filed: May 23, 2012

(65) Prior Publication Data

US 2012/0299380 A1 Nov. 29, 2012

(30) Foreign Application Priority Data

May 26, 2011 (DE) .......................... 10 2011 076 553

(51) Int. Cl.
*H02J 1/10* (2006.01)
*H01L 31/02* (2006.01)

(52) U.S. Cl.
CPC ........... *H01L 31/02021* (2013.01); *Y02E 10/50* (2013.01); *Y10T 307/50* (2015.04)

(58) Field of Classification Search
CPC ..... H01L 31/02021; Y02E 10/50; G05F 3/08; H02J 1/00
USPC .................................................... 307/151, 43
See application file for complete search history.

(56) References Cited

U.S. PATENT DOCUMENTS

| | | | |
|---|---|---|---|
| 7,126,294 B2 * | 10/2006 | Minami et al. ................ 318/139 |
| 7,338,311 B2 | 3/2008 | Laschinksi et al. | |
| 7,609,019 B2 * | 10/2009 | Beck et al. .................... 318/480 |
| 2002/0070703 A1 * | 6/2002 | Allen ............................ 320/101 |
| 2006/0237058 A1 * | 10/2006 | McClintock et al. ......... 136/244 |
| 2009/0097172 A1 * | 4/2009 | Bremicker et al. ............... 361/8 |
| 2010/0085743 A1 * | 4/2010 | Franklin ....................... 362/183 |
| 2010/0156186 A1 * | 6/2010 | Kim et al. ....................... 307/72 |
| 2012/0243279 A1 | 9/2012 | Zacharias et al. | |

FOREIGN PATENT DOCUMENTS

| | | |
|---|---|---|
| DE | 10225259 B3 | 1/2004 |
| DE | 102005024465 A1 | 11/2006 |
| WO | 95/25374 | 9/1995 |

OTHER PUBLICATIONS

Office Action issued in co-pending German Patent application No. 10 2011 076 553.0, issued Apr. 23, 2012, 8 pages.

German Examination Report, Application No. 10 2011 076 553.0, dated May 11, 2015, 7 pages.

* cited by examiner

*Primary Examiner* — Jared Fureman
*Assistant Examiner* — Esayas Yeshaw
(74) *Attorney, Agent, or Firm* — Barley Snyder

(57) ABSTRACT

The present invention relates to a control device for controlling a direct current generated in a photovoltaic system. The control device is configured to alternately enable a current flow through the photovoltaic system for a first time interval and at least to reduce the current flow for a second time interval. The invention further relates to a photovoltaic system comprising such a control device as well as to a method for controlling a direct current generated in a photovoltaic system.

16 Claims, 3 Drawing Sheets

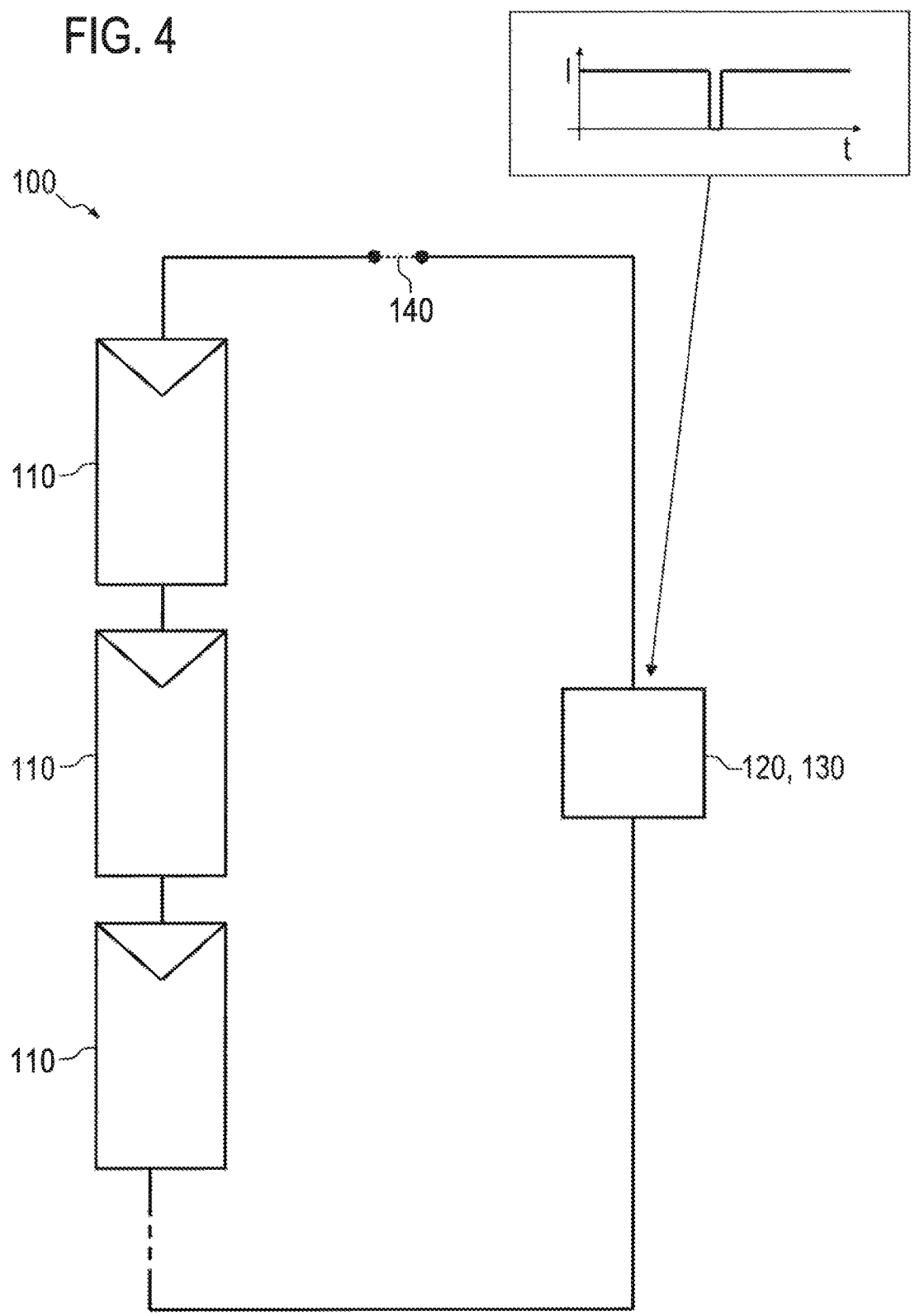

CONTROLLING THE DIRECT CURRENT FLOW IN A PHOTOVOLTAIC SYSTEM

CROSS-REFERENCE TO RELATED APPLICATIONS

This application claims the benefit of the filing date under 35 U.S.C. §119(a)-(d) of German Patent Application No. DE 10 2011 076 553.0, filed May 26, 2011.

FIELD OF THE INVENTION

The present invention relates to a control device for controlling a direct current generated in a photovoltaic system. The present invention further relates to a photovoltaic system comprising such a control device, as well as to a method for controlling a direct current generated in a photovoltaic system.

BACKGROUND

In a photovoltaic system, a part of the sun radiation is converted into electric energy in the form of direct current by means of solar cells. The energy conversion is based on the radiation being subject to an absorption in a solar cell, thus generating positive and negative charge carriers ("electron-hole pairs"). The generated free charge carriers are furthermore separated from each other and are discharged via separate contacts. In a solar module, a plurality of solar cells operating according to this functional principle is generally combined. A photovoltaic system may comprise a plurality of such solar modules, with the solar modules being typically connected in series to form a "string".

A problem of conventional photovoltaic systems is the possible occurrence of an electric arc. Such an electric arc may be formed over a separation distance if an electrical connection or, respectively, a current flow is interrupted. An electric arc may e.g. occur at a solar module, for example due to a fracture in the region of a cell connector provided for connecting solar cells. Other defective positions are possible, as well, e.g. at a connecting box of a solar module or in the region of a wiring of a photovoltaic system.

Since upon the incidence of light, a photovoltaic system generates direct current which flows through the photovoltaic system and its components, an electric arc may persist for a relatively long duration of time. An electric arc exists as long as current and voltage are sufficiently high in order to maintain the current flow across the separation distance. However, the persistence of an electric arc over a long time may cause considerable material damage and bodily injury (e.g. a fire in a family home).

Conventional approaches for preventing this problem relate to the detection of an electric arc and to the active shut-down in such a case. In this context, e.g. WO 95/25374 A1 describes the detecting of an electric arc by means of the electromagnetic radiation emanating from the electric arc and triggering an alarm on the basis thereof as well as switching a partial region of the photovoltaic system in which the electric arc is located in such a way that the electric arc disappears. However, such a procedure involves high complexity.

SUMMARY

Various aspects of the present invention relate to controlling the direct current flow of a photovoltaic system.

One embodiment of the present invention provides a control device for controlling a direct current generated in a photovoltaic system. The control device is configured to alternately enable a current flow through the photovoltaic system for a first time interval and at least to reduce the current flow for a second time interval.

Another embodiment of the present invention provides a photovoltaic system. The photovoltaic system comprises a control device for controlling a direct current generated in the photovoltaic system. The control device is configured to alternately enable a current flow through the photovoltaic system for a first time interval and at least to reduce the current flow for a second time interval.

Another embodiment of the present invention provides a method for controlling a direct current generated in a photovoltaic system. In the method, in an alternate manner, a current flow through the photovoltaic system is enabled for a first time interval and the current flow is at least reduced for a second time interval.

BRIEF DESCRIPTION OF THE DRAWINGS

These and other features of the present invention will become clear from the following description taken in conjunction with the accompanying drawings. It is to be noted, however, that the accompanying drawings illustrate only typical embodiments of the present invention and are, therefore, not to be considered limiting of the scope of the invention. The present invention may admit other equally effective embodiments.

FIG. 4 shows a schematic view of a photovoltaic system comprising a control device which is integrated in an inverter or a direct voltage regulator.

DETAILED DESCRIPTION OF THE EMBODIMENT(S)

Figure 1:
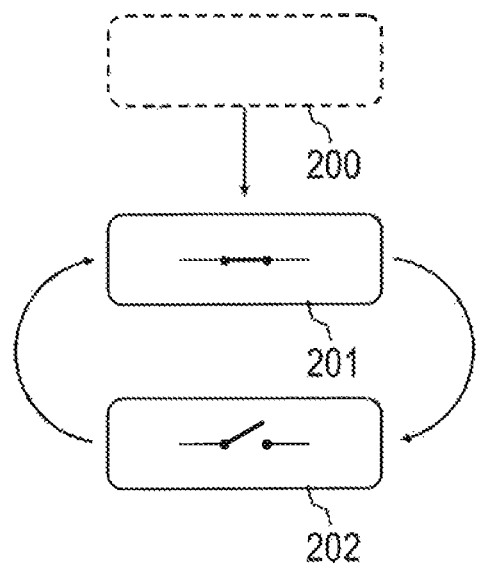
FIG. 1 shows a diagram indicating steps of a method for operating a photovoltaic system.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The present invention provides a control device for controlling a direct current generated in a photovoltaic system. The control device is configured, in an alternate manner, to enable a current flow through the photovoltaic system for a first time interval and at least to reduce the current flow for a second time interval.

By alternately enabling a current flow and reducing the current flow in the photovoltaic system, it is possible to extinguish a potentially occurring electric arc "bridging" a separation distance after a short duration of time. The current reduction in the second time interval may result in that the current flow over the separation distance may no longer be maintained, the electric arc collapsing as a result. Any danger posed by the electric arc, e.g. a fire and any material damage or bodily injury connected thereto, may thus be prevented simply and inexpensively. Apart from reducing the current flow, it is possible that the current flow is interrupted in the second time interval.

In a possible embodiment, the first time interval (considerably) exceeds the second time interval. In this manner, the impact on the efficiency of the photovoltaic system may be kept (as) low (as possible) in spite of the cyclic reduction or interruption of the current flow carried out by the control device. The first time interval may e.g. be in the seconds range and the second time interval may be in the milliseconds range.

In a further embodiment, the first and/or second time interval is dependent on a maximum voltage value of the direct voltage generatable by the photovoltaic system and/or on a maximum current strength of the direct current generatable by the photovoltaic system. In this manner, the reduction or interruption of the current flow carried out by the control device in a recurring sequence may be adjusted to the capacity of the photovoltaic system. For a photovoltaic system having a lower maximum voltage value as well as a smaller maximum current strength and thus a lower output, e.g. a smaller second time interval may be considered in order to shut down a potentially occurring electric arc.

The control device may e.g. be configured in such a way that the first and/or second time interval may be set or, respectively, changed. In this manner, the control device may be used for different photovoltaic systems having different outputs. It may e.g. be provided to adjust the first and/or second time interval to the capacity of the photovoltaic system within the framework of dimensioning or assembling the same.

In a further embodiment, the control device is configured to detect at least one measuring value depending on an output of the photovoltaic system. In this context, the first and/or second time interval depends on the at least one measuring value. In this way, it is possible for the control device to flexibly adjust the first and/or second time interval to the present output power of the photovoltaic system, which depends on the degree of irradiation of the photovoltaic system. Thereby, an impairment of the efficiency of the photovoltaic system as a consequence of the periodic reduction or interruption of the current flow may largely be prevented. In case of a smaller instantaneous output power of the photovoltaic system, for example, an electric arc may be extinguished by means of a smaller second time interval.

The measuring value which may e.g. be detected continuously or step by step by the control device may e.g. be a present voltage value of the direct voltage generated by the photovoltaic system. Moreover, a present current strength of the direct current generated by the photovoltaic system may be considered as a measuring value, as well.

The control device may be realized in various ways. In a possible embodiment, the control device is configured as a separate component which is capable of being integrated in the photovoltaic system.

In a further embodiment, the control device (or, respectively, its functionality) is integrated in an inverter provided for the photovoltaic system or in a direct voltage regulator. An inverter which may be used for grid-connected as well as for off-grid photovoltaic systems serves to convert the direct current solarly generated by the photovoltaic system into an alternating current. A direct voltage regulator which may be used for off-grid photovoltaic systems is used for voltage control or, respectively, voltage stabilization. Due to the integrated configuration, an impairment of the functionality of the inverter or direct voltage regulator due to the control behaviour of the control device may be avoided.

The present invention furthermore provides a photovoltaic system comprising a control device according to any one of the above-described embodiments. Thereby, a high degree of safety may be conferred to the photovoltaic system in a simple and cost-efficient manner.

The present invention furthermore provides a method for controlling a direct current generated in a photovoltaic system. In this context, in an alternate manner, a current flow through the photovoltaic system is enabled for a first time interval and the current flow is at least reduced for a second time interval. By means of this, it is possible to extinguish an electric arc occurring at a separation distance after a short duration of time, thus preventing the danger of material damage or, respectively, bodily injury in a simple manner. Apart from reducing the current flow, it is also possible that the current flow is interrupted in the second time interval.

In a possible embodiment, at least one measuring value depending on an output of the photovoltaic system is detected. The first and/or the second time interval further depends on the at least one measuring value. By means of this, the first and/or second time interval may be flexibly adjusted to the current output power of the photovoltaic system so that the efficiency of the photovoltaic system may only be insubstantially reduced in spite of the recurring sequence of reducing or interrupting the current flow.

In a further embodiment, it is provided to reduce the first time interval and/or to increase the second time interval in case the measuring value increases. In an analogous manner, a contrarious modification of the first and/or the second time interval may be considered if the measuring value decreases.

Further embodiments are explained in more detail in the following in conjunction with the accompanying drawings.

With the help of the following figures, a concept is described by means of which any danger due to the generation of an electric arc in a photovoltaic system 100 may reliably be prevented. The photovoltaic system 100 which is also referred to as solar plant 100, potential embodiments of which are described below in detail in conjunction with FIGS. 3 and 4, comprises at least one solar module 110 which generates a direct current when irradiated with sunlight. The direct current flows through the photovoltaic system 100 or, respectively, its components which are interconnected in the form of an electric circuit. An electric arc may occur during the operation of the photovoltaic system 100 in case the electric circuit is interrupted or, respectively, disconnected, the electric arc bridging a corresponding separation distance. A possible cause for such an interruption may be a defect which may e.g. occur at a solar module 110 or may e.g. be present or, respectively, occur at a wiring of the photovoltaic system 100.

In order to prevent any danger, e.g. (considerable) material damage or bodily injury, in spite of the electric arc, it is provided to control the direct current generated in the photovoltaic system 100 by irradiation and flowing through the photovoltaic system 100 or, respectively, its components in such a way that the current flow is reduced or interrupted in a recurring sequence similar to an alternating current circuit. By means of this procedure, it may be achieved that the electric arc collapses after a short duration of time and thus no longer poses any danger. Contrary to a conventional procedure of detecting or, respectively, determining an electric arc and actively switching off the photovoltaic system 100, this approach may be realized in a considerably simpler and more cost-efficient way.

FIG. 1 indicates a diagram in which steps of a method for operating a photovoltaic system 100 according to the above-described concept are illustrated. The method comprises two steps 201, 202, which are carried out one after another in a cyclic manner. In step 201, which is illustrated by a closed switch, a current flow of the direct current generated in the photovoltaic system 100 due to irradiation is enabled through the photovoltaic system 100 for a first time interval T1, so that the electric power solarly generated by means of the solar module(s) 110 of the photovoltaic system 100 may be transmitted in an unimpeded manner. In step 202, on the other hand, the current flow through the photovoltaic system 100 is at least reduced or even interrupted for a second time interval T2. This is indicated for step 202 by means of an open switch.

Thus, in step 201, a solarly generated electric initial current or, respectively, a first current may flow. Said electric current may be defined by the electric circuit of the photovoltaic system 100 or, respectively, by the electric components interconnected herein. Contrary thereto, step 202 may comprise actively influencing the electric current so that a second current flows which is reduced with regard to the initial current, or, alternatively, the current flow is interrupted.

Figure 2:
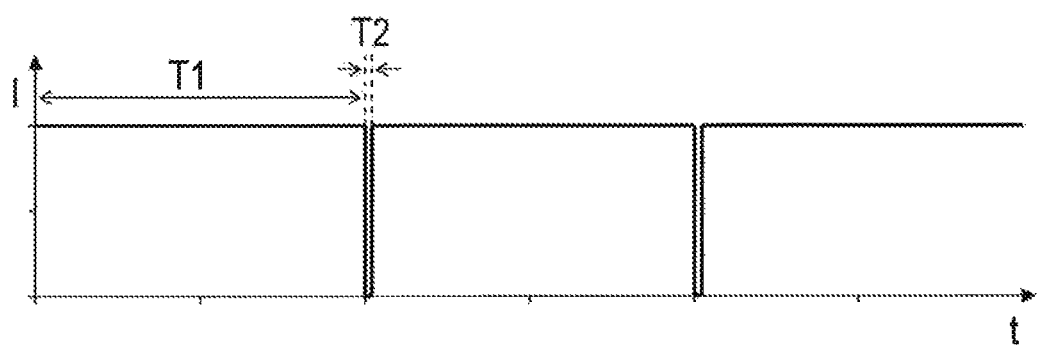
FIG. 2 shows a schematic temporal scheme of a controlled current flow of a photovoltaic system.

In order to exemplarily illustrate this operating mode, FIG. 2 shows a possible time scheme of a (direct) current I of the photovoltaic system 100 depending on time t, the (direct) current I being controlled according to steps 201, 202 with the time intervals T1, T2. The current I comprises a clocked or, respectively, impulse-type characteristic, wherein the "current pulses" with the time duration T1 may e.g. have a rectangular shape, as shown in FIG. 2. Here, in each case the current I flows with a constant (initial) current strength during the first time duration T1, and the current flow is in each case interrupted in the second time duration T2. Instead of the rectangular shape depicted in FIG. 2 showing an abrupt increase and decrease of the current I, other pulse shapes may occur, e.g. showing a linear or exponential increase and decrease of the current I. This holds true in an analogous manner for embodiments in which a current reduction, and not a current interruption, takes place in the time interval T2.

Due to the periodic enabling of an unhampered flow of direct current and reducing or, respectively, preventing of the current flow, which is carried out over the entire operating time of the photovoltaic system 100 during which the photovoltaic system 100 is subject to an irradiation and thus produces electric energy, an electric arc formed in the photovoltaic system 100 at a separation distance may be extinguished after a relatively short time. In this way, any danger, e.g. a fire and thus (considerable) material damage or, respectively, bodily injury, may be prevented.

For example, an electric arc occurring in a time interval T1 may disappear during a time interval T2 directly following the generation of the electric arc. It is also possible that an electric arc is not extinguished until after repeatedly limiting or, respectively, interrupting the current I, wherein a burning of the electric arc at first comes along with a (substantially uncritical) increase of the separation distance, until the separation distance has reached a corresponding size and a reduction or interruption of the current I leads to a disappearance of the electric arc.

Furthermore, it becomes obvious from FIG. 2 that the time interval T1, during which the solarly generated direct current I flows in the photovoltaic system 100 (without active influence or, respectively, limitation) may be substantially larger than the time interval T2 in which the current flow is interrupted or reduced. By means of this, it may be achieved that the efficiency of the photovoltaic system 100 is affected as little as possible or, respectively, only insubstantially in spite of the periodic interruption or reduction of the current. As an example, the first time interval T1 may be in the seconds range and the second time interval T2 may be in the milliseconds range.

The above-mentioned values for the time intervals T1 and T2 are to be considered as mere examples and may vary depending on the respective configuration of the photovoltaic system 100 (e.g. comprising crystalline silicon solar cells or thin-film solar cells) and depending on the efficiency of the photovoltaic system 100. For example, in case of a smaller output of the photovoltaic system 100 in question, the extinguishing of an electric arc may possibly be effected by means of a smaller second time interval T2. In general terms, it may be considered for the time intervals T1, T2 to render the first time interval T1 at most as long as a danger emanating from the burning of an electric arc is to be permitted, and to render the second time interval T2 at least long enough for an electric arc to disappear (with high certainty).

Provided that a current reduction is carried out instead of a current interruption in the second time interval T2, the current or, respectively, its current strength may be reduced below a predetermined value. This boundary or threshold value may also depend on the respective configuration or, respectively, the capacity of the photovoltaic system 100. As an example, in a photovoltaic system 100, in which the generatable (direct) voltage has a maximum value of up to 1500V, a reduction of the current strength to a value below 1A (starting from an initial current strength of e.g. 8A) may be considered. The above-mentioned values merely serve as examples, as well, which may be replaced by different values.

The generating of an impulse-type or, respectively, clocked direct current in the above-described manner, by means of which the power transmitted in the electric circuit of the photovoltaic system 100 in question assumes an impulse-type characteristic, as well, may be carried out by means of a control device 130 associated with the photovoltaic system 100, the control device 130, in a recurring sequence, enabling a direct current flow through the photovoltaic system 100 in the time interval T1, and at least reducing the current flow in the time interval T2. Such a control device 130 may be embedded in a photovoltaic system 100 in various ways. Possible configurations will be described in more detail in the following in conjunction with FIGS. 3 and 4. In this context, it is to be noted that reference is made to the above-described description with regard to already described details which refer to similar or identical aspects, possible advantages etc.

Figure 3:
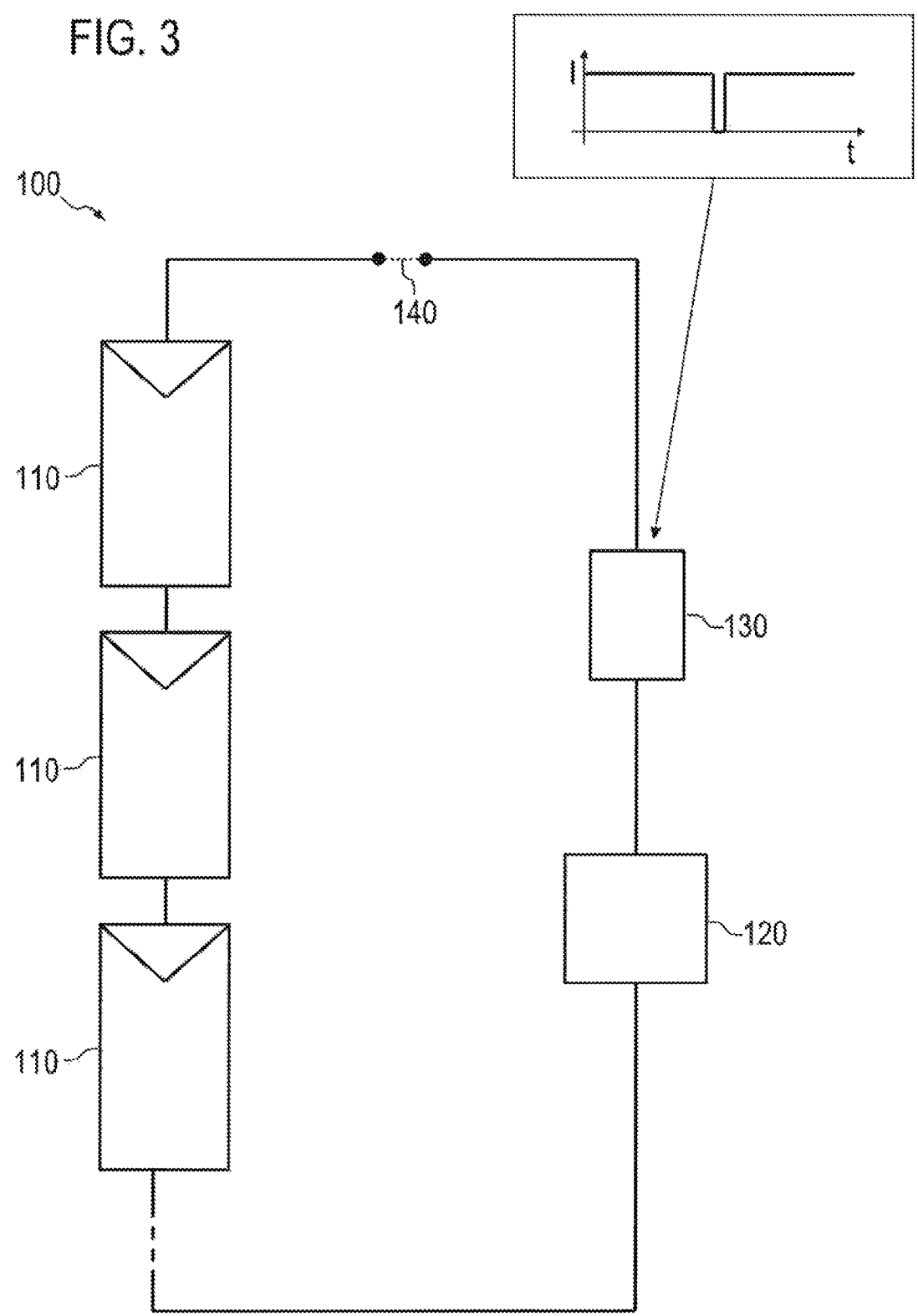
FIG. 3 shows a schematic view of a photovoltaic system comprising a control device in form of a separate component.

FIG. 3 depicts a schematic view of a photovoltaic system 100 comprising a plurality of interconnected solar modules 110 which may also be referred to as photovoltaic generators. As indicated in FIG. 3, the solar modules 110 may be interconnected in series as what is referred to as a "string". Moreover, the photovoltaic system 100 comprises a device 120 connected to the solar modules 110. The components of the photovoltaic system 100 are electrically interconnected via corresponding conductors or, respectively, "solar cables" and thus form an electric circuit.

The device 120 may e.g. be an inverter 120, by means of which the direct current generated by the solar modules 110 when irradiated with sunlight may be converted into an alternating current. The photovoltaic system 100 may in this context be a grid-connected photovoltaic system 100, the electric energy of which may be fed into an alternating current network by the inverter 120. The photovoltaic system 100 may also be an off-grid photovoltaic system 100, wherein an alternating current for alternating current loads may be provided via the inverter 120.

In an alternative embodiment which may be considered in case of an off-grid photovoltaic system 100, as well, the device 120 may also be a direct voltage regulator 120 provided for direct current loads. The direct voltage regulator 120 is used for voltage control or, respectively, voltage stabilization.

The photovoltaic system 100 depicted in FIG. 3 further comprises a control device 130 which is configured to carry out the alternate enablement and reduction or, respectively, interruption of the direct current supplied by the solar modules 110 and flowing through the photovoltaic system 100 during the time intervals T1 and T2. The control device 130 is configured as a separate appliance or component which is integrated in the photovoltaic system 100 or, respectively, in its electric circuit. In this context, the control device 130 is connected to components of the photovoltaic system 100 via corresponding conductors, as well, e.g. to a solar module 110 and to the device 120, as depicted in FIG. 3. In an alternative embodiment, the control device 130 may also be arranged at a different position of the electric circuit of the photovoltaic system 100, e.g. between two solar modules 110. The electric circuit of the photovoltaic system 100 may further supply the control device 130 with electric energy for operating the same.

FIG. 3 further illustrates the occurrence of an arc gap 140 in the electric circuit of the photovoltaic system 100, wherein an electric arc bridges a corresponding separation distance. The arc gap 140, which is arranged in series with the solar modules 110, may e.g. occur in the region of the wiring of the photovoltaic system 100. However, a different location, e.g. in the region of a solar module 110, is conceivable, as well. Due to the cyclic reduction or interruption of the current flow in the electric circuit of the photovoltaic system 100 carried out by means of the control device 130, the electric arc may be cut off or, respectively, extinguished within a short time.

In order to comply with such a functionality, the control device 130 may e.g. comprise, as is indicated in steps 201, 202 of FIG. 1, a switching device arranged in the electric circuit of the photovoltaic system 100, e.g. in the form of a semiconductor switch. The control device 130 may in this context be controlled or, respectively, time-controlled in such a way that, in a cyclic manner, in each case an initial first current flows in the time interval T1 and a reduced second current flows in the time interval T2, or alternatively the electric circuit is "closed" or "open" in the time intervals T1 and T2, and thus the current flow is respectively interrupted in the time interval T2. Instead of a switching device, the control device 130 may also comprise different components or, respectively, be configured differently.

FIG. 4 shows a schematic view of a further configuration of a photovoltaic system 100 being similar to FIG. 3, which also comprises a plurality of solar modules 110 connected in the form of a "string", as well as a device 120, i.e. an inverter or direct voltage regulator. In this context, the photovoltaic system 100 may again be a grid-connected or an off-grid photovoltaic system 100.

Furthermore, in the photovoltaic system 100 shown in FIG. 4, as well, a control device 130 for alternately enabling and reducing or interrupting the direct current supplied by the solar modules 110 is provided in order to extinguish an electric arc at an arc gap 140 within a short time. The control device 130 is in this context integrated in the inverter 120 or direct voltage regulator 120 provided for the photovoltaic system 100. This may also include a configuration of the inverter 120 or of the direct voltage regulator 120, in which the functionality of the control device 130 is integrated in the inverter 120 or direct voltage regulator 120, and the inverter 120 or the direct voltage regulator 120 itself takes over the function of the cyclic current reduction or interruption as the control device 130. The integrated configuration makes it possible with high reliability to prevent an impairment of the functionality of the inverter 120 (inversion) or of the direct voltage regulator 120 (voltage regulation or, respectively, voltage stabilization) caused, as the case may be, by the periodic control behaviour. For further possible details relating to the control device 130, which may analogously apply in this context, reference is made to the above description.

In the following, further possible aspects of a control device 130 are described in more detail. These may apply to the control devices 130 described in conjunction with FIGS. 3 and 4, as well as to differently configured control devices 130.

As has already been indicated above, the time intervals T1, T2 according to which a direct current may be controlled or, respectively, clocked by means of a control device 130 in order to achieve a quick extinguishing of an electric arc in a photovoltaic system 100, may depend on the respective configuration or, respectively, on the capacity of the photovoltaic system 100 in question. For the periodic interruption of the current flow to be attended only by as small an impairment of the efficiency of the photovoltaic system 100 as possible, it may be provided to adjust the control device 130 or, respectively, its control behaviour to the capacity of the photovoltaic system 100.

In this regard, the control device 130 used for controlling the current flow may be configured in such a way that at least one of the two or both time intervals T1 and T2 depend on a maximum voltage value of the direct voltage ("string voltage") generatable by the photovoltaic system 100 and/or on a maximum current strength of the direct current generatable by the photovoltaic system 100. Compared to a different photovoltaic system 100, in a photovoltaic system 100 with smaller capacity (i.e. smaller maximum voltage and/or smaller maximum current) a longer first time interval T1 and/or a smaller second time interval T2 may be provided in order to make a potentially occurring electric arc disappear (as well) and thus to allow for a safe functionality.

The control device 130 may furthermore be configured in such a way that the time intervals T1, T2 are firmly specified and the temporal control of the current flow is thus carried out with an unmodified period. In this manner, the control device 130 may be realized with a simple and cost-effective design.

Moreover, it is possible to configure the control device 130 in such a way that at least one of the two or both time intervals T1, T2 may be predefined or, respectively, set and/or modified by a user. As a result, the control device 130 may be utilized in different photovoltaic systems 100 with different capacities. It is e.g. possible to adjust the time interval T1 and/or the time interval T2 to the capacity of the associated photovoltaic system 100 within the framework of dimensioning or assembling the same. In this context, the above-described maximum voltage value and/or the maximum current strength of the photovoltaic system 100 may be consulted as reference value(s).

Setting the control device 130 in such a way or, respectively, providing of time intervals T1 and/or T2 for the control behaviour of the same is indicated in the diagram of FIG. 1 by means of a further step 200. The step 200 may be carried out during dimensioning or, respectively, assembling the associated photovoltaic system 100, or at a different point in time, e.g. within the framework of an expansion or, respectively, a modification of the photovoltaic system 100 and thus its capacity. It is also possible to refit an already existing photovoltaic system 100 by means of a control device 130 (e.g. in the form of an accessory device according to FIG. 3 or in the form of a configuration integrated in an inverter 120 or direct voltage regulator 120 according to FIG. 4), wherein the control device 130 may be set within the framework of step 200 and adjusted to the photovoltaic system 100.

Instead of firmly specifying or, respectively, firmly setting the time intervals T1, T2, a flexible adjustment of at least one of the two or of both time intervals T1, T2 to the current output of the photovoltaic system 100 may alternatively be provided, the current output depending on the degree of irradiation of the photovoltaic system 100. In this context, at least one measuring value depending on the present output of the photovoltaic system 100, e.g. an updated voltage value of the direct voltage generated by the photovoltaic system 100 and/or an updated current strength of the direct current generated by the photovoltaic system, may be detected. Depending on the measuring value or, respectively, its change, the time intervals T1, T2 may be modified accordingly or maintained. With regard to an adjustment of the time intervals T1, T2 to the measuring value, it is conceivable that the time intervals T1, T2 or one of the two time intervals T1, T2 are/is adjusted continuously or gradually depending on the measuring value (or, respectively, its change). By adjusting the time intervals T1, T2, it may be achieved that the efficiency of the photovoltaic system 100 may only be insubstantially reduced in spite of the periodic reduction or interruption of the current flow.

A control device 130 provided for such a functionality, which is configured for detecting the at least one measuring value and for adjusting the time interval T1 and/or the time interval T2, may comprise one or a plurality of corresponding measuring devices (e.g. a current measurement device or, respectively, a voltage measurement device) for detecting the at least one measuring value. In this context, it may be provided to determine the at least one measuring value e.g. continuously or gradually in predefined time segments. With regard to the diagram of FIG. 1, e.g. step 200 may illustrate such a detection of a measuring value carried out by means of the control device 130 or, respectively, by means of a measuring device associated with the control device 130, as well as an adjustment of at least one of the two or both time intervals T1, T2 by means of the control device 130.

When the measuring value increases (and a higher instantaneous power is thus detected), e.g. the first time interval T1 may be reduced and/or the second time interval T2 may be increased. In other words, an increase of the output-dependent measuring value may be connected to an increase of the duty cycle T2/(T1+T2). Analogously, in the case of a reduction of the measuring value, a modification contrarious thereto may be provided, i.e. an increase of the first time interval T1 and/or a reduction of the second time interval T2. In this context, the duty cycle T2/(T1+T2) may be reduced accordingly.

The embodiments described in conjunction with the drawings are exemplary embodiments of the invention. Apart from the described and depicted embodiments, further embodiments are conceivable which may comprise further modifications or, respectively, feature combinations.

The use of a control device 130 for generating a clocked or impulse-type direct current flow is not limited to the embodiment examples of solar or, respectively, photovoltaic systems 100 shown in FIGS. 3 and 4. A control device 130 for controlling the direct current flow during the entire operating time of a photovoltaic system 100 in which the photovoltaic system 100 is subject to an irradiation, thus generating electric energy, may also be considered for other or, respectively, differently configured photovoltaic systems 100. For example, photovoltaic systems 100 comprising only one solar module 110, or other photovoltaic systems 100, in which solar modules 110 are interconnected differently, e.g. in a parallel connection, fall under this category.

With regard to a control device 130, as well, modifications deviating from the embodiments of FIGS. 3 and 4 (separate assembly group, integration in or with an inverter or direct voltage regulator) are possible. For example, a control device 130 used for cyclic current limitation or current interruption may be integrated in a solar module 110 of a photovoltaic system 100 or, respectively, in a connecting box of a solar module 110.

With regard to an operating mode in which a current is reduced instead of interrupted in the second time interval T2, it may be provided that the threshold value, below which the current is reduced, also (i.e. comparable to the time intervals T1, T2) depends on a parameter such as the maximum voltage value of the direct voltage generatable by the associated photovoltaic system 100 and/or the maximum current strength of the direct current generatable by the photovoltaic system 100. In this context, as well, a control device 130 used for controlling the current flow may be configured for correspondingly setting or modifying the threshold value by a user.

Furthermore, it may be considered with regard to the threshold value to adjust it to a current output power of the photovoltaic system. In this context, the threshold value (comparable to the time intervals T1, T2) may depend on at least one measuring value referring to the present output of the photovoltaic system 100. In this context, as well, a control device 130 used for controlling the current flow may be configured for detecting the measuring value (e.g. the voltage value of the direct voltage generated by the photovoltaic system 100 and/or the current strength of the direct current generated by the photovoltaic system 100) and adjusting or, respectively, modifying the threshold value depending on the measuring value.

The preceding description describes exemplary embodiments of the invention. The features disclosed therein and the claims and the drawings can, therefore, be useful for realizing the invention in its various embodiments, both individually and in any combination. While the foregoing is directed to embodiments of the invention, other and further embodiments of this invention may be devised without departing from the basic scope of the invention, the scope of the present invention being determined by the claims that follow.

What is claimed is:

1. A control device for controlling a direct current generated in a photovoltaic system,
wherein the control device is configured to alternately enable a current flow through the photovoltaic system for a first time interval and at least to reduce the current flow for a second time interval,
wherein the first time interval exceeds the second time interval,
wherein the first time interval is in the seconds range, and
wherein the second time interval is in the milliseconds range.

2. The control device according to claim 1, wherein the first time interval or the second time interval or the first and second time interval depend on at least one of the following parameters:

maximum voltage value of the direct voltage generatable by the photovoltaic system; and maximum current strength of the direct current generatable by the photovoltaic system.

3. The control device according to claim 1, wherein the control device is configured to detect at least one measuring value depending on an output of the photovoltaic system, and wherein the first time interval or the second time interval or the first and second time interval depend on the at least one measuring value.

4. The control device according to claim 3, wherein the at least one measuring value is one of the following values:

voltage value of the direct voltage generated by the photovoltaic system; and current strength of the direct current generated by the photovoltaic system.

5. The control device according to claim 1, wherein the control device is configured as a separate component which is capable of being integrated in the photovoltaic system.

6. The control device according to claim 1, wherein the control device is integrated in an inverter or in a direct voltage regulator of the photovoltaic system.

7. A photovoltaic system comprising a control device for controlling a direct current generated in the photovoltaic system, wherein the control device is configured to alternately enable a current flow through the photovoltaic system for a first time interval and at least to reduce the current flow for a second time interval, wherein the first time interval exceeds the second time interval, wherein the first time interval is in the seconds range, and wherein the second time interval is in the milliseconds range.

8. The photovoltaic system according to claim 7, wherein the first time interval or the second time interval or the first and second time interval depend on at least one of the following parameters:

maximum voltage value of the direct voltage generatable by the photovoltaic system; and maximum current strength of the direct current generatable by the photovoltaic system.

9. The photovoltaic system according to claim 7, wherein the control device is configured to detect at least one measuring value depending on an output of the photovoltaic system, and wherein the first time interval or the second time interval or the first and second time interval depend on the at least one measuring value.

10. The photovoltaic system according to claim 9, wherein the at least one measuring value is one of the following values:

voltage value of the direct voltage generated by the photovoltaic system; and current strength of the direct current generated by the photovoltaic system.

11. The photovoltaic system according to claim 7, wherein the control device is one of:

a separate component which is integrated in the photovoltaic system; or an integrated component of an inverter or of a direct voltage regulator of the photovoltaic system.

12. A method for controlling a direct current generated in a photovoltaic system, wherein in an alternate manner, a current flow through the photovoltaic system is enabled for a first time interval and the current flow is at least reduced for a second time interval, wherein the first time interval exceeds the second time interval, wherein the first time interval is in the seconds range, and wherein the second time interval is in the milliseconds range.

13. The method according to claim 12, wherein the first time interval or the second time interval or the first and second time interval depend on at least one of the following parameters:

maximum voltage value of the direct voltage generatable by the photovoltaic system; and maximum current strength of the direct current generatable by the photovoltaic system.

14. The method according to claim 12, wherein at least one measuring value depending on an output of the photovoltaic system is detected, and wherein the first time interval or the second time interval or the first and second time interval depend on the at least one measuring value.

15. The method according to claim 14, wherein the at least one measuring value is one of the following values:

voltage value of the direct voltage generated by the photovoltaic system; and current strength of the direct current generated by the photovoltaic system.

16. The method according to claim 14, wherein at least one of the following steps is carried out in case the measuring value increases:

reducing the first time interval; and increasing the second time interval.

* * * * *